US009804464B2

(12) United States Patent
Gao

(10) Patent No.: US 9,804,464 B2
(45) Date of Patent: Oct. 31, 2017

(54) ARRAY SUBSTRATE AND METHOD FOR PREPARING THE SAME, LIQUID CRYSTAL PANEL

(71) Applicant: Shenzhen China Star Optoelectronics Technology Co., Ltd., Guangdong (CN)

(72) Inventor: Dongzi Gao, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 142 days.

(21) Appl. No.: 14/777,876

(22) PCT Filed: Apr. 27, 2015

(86) PCT No.: PCT/CN2015/077556
§ 371 (c)(1),
(2) Date: Sep. 17, 2015

(87) PCT Pub. No.: WO2016/161672
PCT Pub. Date: Oct. 13, 2016

(65) Prior Publication Data
US 2017/0108722 A1 Apr. 20, 2017

(30) Foreign Application Priority Data
Apr. 9, 2015 (CN) .......................... 2015 1 0166113

(51) Int. Cl.
G02F 1/136 (2006.01)
G02F 1/1368 (2006.01)
(Continued)

(52) U.S. Cl.
CPC ...... G02F 1/1368 (2013.01); G02F 1/133345 (2013.01); G02F 1/133514 (2013.01);
(Continued)

(58) Field of Classification Search
CPC ............. G02F 1/1368; G02F 1/133345; G02F 1/133514; G02F 1/134309
(Continued)

(56) References Cited

U.S. PATENT DOCUMENTS 5,668,379 A * 9/1997 Ono .................... H01L 27/1259
257/347
8,553,184 B2 10/2013 Gao
(Continued)

FOREIGN PATENT DOCUMENTS

CN 101807550 8/2010
CN 102033375 4/2011
(Continued)

OTHER PUBLICATIONS

International Search Report for PCT/CN2015/077556, English translation attached to original, Both completed by the Chinese Patent Office dated Dec. 15, 2015, All together 6 Pages.

Primary Examiner — Lucy Chien
(74) Attorney, Agent, or Firm — Brooks Kushman P.C.

(57) ABSTRACT

An array substrate includes a glass substrate and a plurality of pixel structures formed on the glass substrate, each pixel structure includes a light transmitting region and a light non-transmitting region, wherein the light non-transmitting region includes a gate electrode, a gate insulating layer, an active layer, a source electrode, a drain electrode and a passivation layer sequentially formed on the glass substrate; and the light transmitting region includes a pixel electrode which is directly formed on the glass substrate, and the pixel electrode extends to the light non-transmitting region and is electrically connected to the source electrode or the drain electrode. A method of preparing the array substrate and a liquid crystal panel including the array substrate are also provided.

15 Claims, 4 Drawing Sheets

(51) Int. Cl.
    *G02F 1/1333*     (2006.01)
    *G02F 1/1343*     (2006.01)
    *G02F 1/1362*     (2006.01)
    *G02F 1/1335*     (2006.01)

(52) U.S. Cl.
    CPC .. *G02F 1/134309* (2013.01); *G02F 1/136227* (2013.01); *G02F 1/136286* (2013.01); *G02F 2001/133302* (2013.01); *G02F 2001/136295* (2013.01); *G02F 2201/123* (2013.01)

(58) Field of Classification Search
    USPC .......................................................... 349/46
    See application file for complete search history.

(56) References Cited

U.S. PATENT DOCUMENTS

| | | |
|---|---|---|
| 8,817,214 B2 | 8/2014 | Park |
| 8,860,898 B2 | 10/2014 | Xie |
| 2002/0093016 A1 | 7/2002 | Lim et al. |
| 2011/0075086 A1 | 3/2011 | Park |
| 2016/0141314 A1 | 5/2016 | Zhang et al. |

FOREIGN PATENT DOCUMENTS

| | | |
|---|---|---|
| CN | 201867561 | 6/2011 |
| CN | 103149760 | 6/2013 |

\* cited by examiner

ARRAY SUBSTRATE AND METHOD FOR PREPARING THE SAME, LIQUID CRYSTAL PANEL

CROSS-REFERENCE TO RELATED APPLICATION

This application is the U.S. national phase of PCT Application No. PCT/CN2015/077556 filed on Apr. 27, 2015, which claims priority to CN Patent Application No. 201510166113.3 filed on Apr. 9, 2015, the disclosures of which are incorporated in their entirety by reference herein.

TECHNICAL FIELD

The present invention relates to liquid crystal display technical field, and more particularly, to an array substrate and a method of preparing the same, as well as a liquid crystal panel including the array substrate.

BACKGROUND ART

A liquid crystal display (LCD) is a display apparatus of which the panel is ultra-thin, and a liquid crystal panel is an importance component of the LCD. Common liquid crystal panel at least comprises an array substrate and a color filter substrate disposed opposite to each other, and a liquid crystal layer between the array substrate and the color filter substrate.

The array substrate always comprises a glass substrate and a plurality of pixel structures formed on the glass substrate. FIG. 1 is a block diagram of an existing array substrate and merely shows an exemplary pixel structure therein. As shown in FIG. 1, a pixel structure 1 includes a light transmitting region 1a and a light non-transmitting region 1b, and the light non-transmitting region 1b includes a gate electrode 3, a gate insulating layer 4, an active layer 5, an ohmic contact layer 6, source/drain electrodes 7a and 7b, and a passivation layer 8 sequentially formed on a glass substrate 2; and the light transmitting region 1a includes a gate insulating layer 4, a passivation layer 8 and a pixel electrode 9 sequentially formed on the glass substrate 2, and the pixel electrode 9 extends to the light non-transmitting region 1b and is electrically connected to the source electrode 7a or drain electrode 7b through a via hole 8a.

In the liquid crystal display device, the light emitted from the backlight is absorbed and refracted through a polarizer, a glass substrate, a liquid crystal layer and a color filter etc successively, and then the light transmittance is about 6%, thus increasing light transmittance is effective to improve utilization of backlight. In the array substrate with the above structure, as shown in FIG. 1, in the light transmitting region 1a of the pixel structure 1, between the pixel electrode 9 and the glass substrate 2 also includes the gate insulating layer 4 and the passivation layer 8. In the array substrate, the gate insulating layer 4 and the passivation layer 8 mainly server to separate different metal layers in the light non-transmitting region 1b, but with respect to the pixel electrode 9 and the glass substrate 2 in the light transmitting region 1a, the gate insulating layer 4 and the passivation layer 8 are redundant and may absorb and refract a part of light so as to loss part of light, such that the light transmittance is decreased, to thereby reduce the utilization of the backlight.

SUMMARY

As for defects in the related art, the present invention provides an array substrate and the method of preparing the same, and by improving the pixel structure in the array substrate, the light transmittance of the light transmitting region in the pixel structure is increased, thus the utilization of the backlight is increased.

To achieve the above purpose, the present invention adopts the following technical solution:

An array substrate includes a glass substrate and a plurality of pixel structures formed on the glass substrate, each pixel structure includes a light transmitting region and a light non-transmitting region, wherein the light non-transmitting region includes a gate electrode, a gate insulating layer, an active layer, a source electrode, a drain electrode and a passivation layer which are sequentially formed on the glass substrate; the light transmitting region includes a pixel electrode which is directly formed on the glass substrate, and the pixel electrode extends to the light non-transmitting region and is electrically connected to the source electrode or the drain electrode.

Herein, a via hole is provided on the passivation layer and through which the pixel electrode is electrically connected to the source electrode or the drain electrode.

Herein, an ohmic contact layer is provided between the active layer and the source/drain electrodes.

Herein, the material of the gate insulating layer is $SiN_x$ or $SiO_x$.

Herein, the material of the passivation layer is $SiN_x$ or $SiO_x$.

A method of preparing a array substrate comprises the following steps:

S10: preparing a gate electrode on the glass substrate;

S20: sequentially preparing a gate insulating layer thin film, an active layer, an ohmic contact layer, a source electrode and a drain electrode on the glass substrate after the step S10, wherein the gate insulating layer thin film covers a light transmitting region and a light non-transmitting region of the pixel structure;

S30: preparing a passivation layer thin film on the glass substrate after step S20, wherein the passivation layer thin film covers the light transmitting region and the light non-transmitting region of the pixel structure;

S40: preparing a via hole on the passivation layer thin film by etching process, and etching the gate insulating layer thin film and the passivation layer thin film covered on the light transmitting region, such that the light transmitting region exposes the glass substrate; and S50: preparing a pixel electrode on the glass substrate after step S40, wherein the pixel electrode in the light transmitting region is connected to glass substrate, and the pixel electrode is electrically connected to the source electrode or the drain electrode through the via hole.

Herein, the Step S10 specifically includes:

forming a layer of gate metal thin film on the glass substrate;

coating a photoresist on the gate metal thin film and reserving the photoresist of a gate pattern region by exposing and developing the photoresist; and etching away the exposed gate metal thin film and removing the residual photoresist so as to form the gate electrode.

Herein, the Step S20 specifically includes:

sequentially forming a gate insulting layer thin film, an active layer thin film, an ohmic contact layer thin film and a source/drain metal thin film on the glass substrate which the gate electrode has already been formed on, and coating a photoresist on the source/drain metal thin film;

exposing and developing the photoresist with a double-tone mask, and retaining the photoresist corresponding to a source region and a drain region, and the photoresist corresponding to a channel region;

etching away the exposed source/drain metal thin film, the ohmic contact layer thin film and the active layer thin film;

removing the photoresist corresponding to the channel region through ashing process, and etching the ohmic contact layer thin film and the source/drain metal thin film on the channel region; and removing the residual photoresist to obtain the gate insulating layer thin film, the active layer, the ohmic contact layer and the source/drain electrodes.

Herein, the Step S40 specifically includes:

coating photoresist on the passivation layer thin film, and exposing the passivation layer thin film on a via hole region and the light transmitting region by exposing and developing the photoresist;

etching away the passivation layer thin film from the via hole region through etching process, so as to obtain the via hole; and etching away the passivation layer thin film and the gate insulating layer thin film from the light transmitting region, so as to expose the glass substrate.

An embodiment of the present invention also provides a liquid crystal panel which includes an array substrate and a color filter substrate disposed opposite to each other, and a liquid crystal layer between the array substrate and the color filter substrate, wherein the array substrate uses the above mentioned array substrate.

Compared with the related art, the array substrate and the liquid crystal panel provided according to the embodiments of the present invention improve the pixel structure in the array substrate by removing the gate insulating layer and the passivation layer in the light transmitting region, such that the pixel electrode in the light transmitting region is directly disposed on the glass substrate, to thereby increase the light transmittance of the light transmitting region in the pixel structure, and increase the utilization of the backlight.

DETAILED DESCRIPTION OF EXEMPLARY EMBODIMENTS

Hereinafter, the technical solutions in embodiments of the present invention will be described in details with reference to the attached drawings and detailed embodiments. Obviously, the described embodiments are only a part of embodiments in the present invention, not all embodiments. Based on the embodiments in the present invention, all other embodiments acquired without exerting any creative work by those skilled in the art fall within the protection scope of the present invention.

Figure 1:
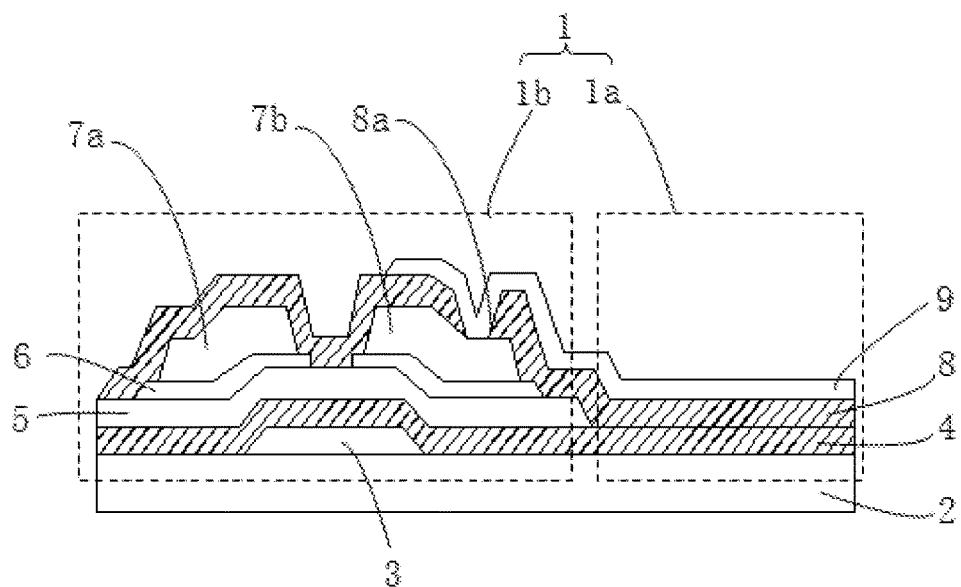
FIG. 1 is a structural diagram of an existing array substrate.
Figure 2:
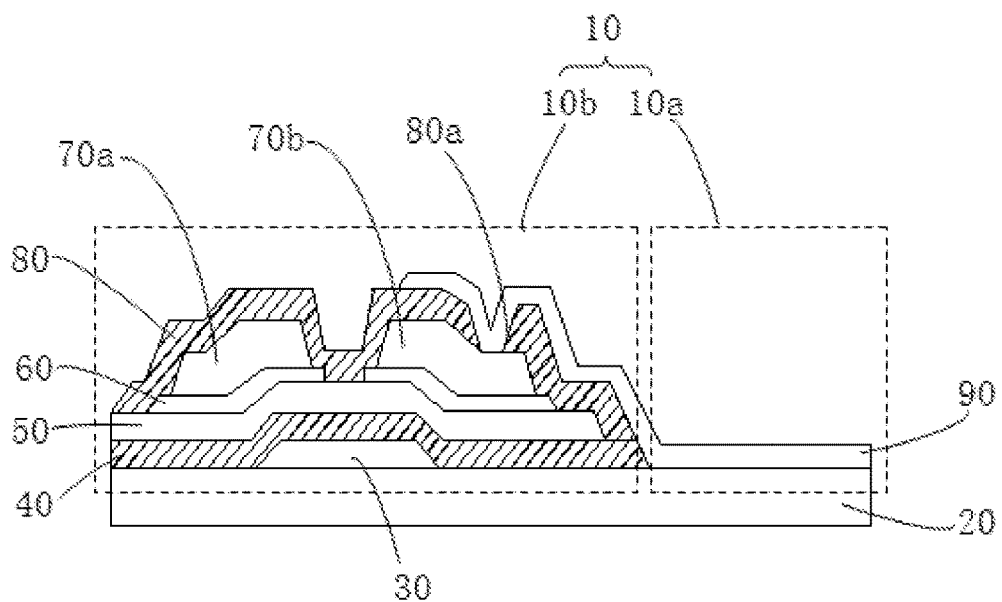
FIG. 2 is a structure diagram of the array substrate provided by an embodiment of the present invention.

Referring to FIG. 2, the embodiment provides an array substrate which includes a glass substrate 20 and a plurality of pixel structures 10 (FIG. 2 shows exemplary part sectioned view of a pixel structure 10 therein) formed on the glass substrate 20, wherein the pixel structure 10 includes a light transmitting region 10a and a light non-transmitting region 10b. Herein, the light non-transmitting region 10b includes a gate electrode 30, a gate insulating layer 40, an active layer 50, a source electrode 70a, a drain electrode 70b, and a passivation layer 80 sequentially formed on the glass substrate 20. The light transmitting region 10a includes a pixel electrode 90 which is directly formed on the glass substrate 20, and the pixel electrode 90 extends to the light non-transmitting region 10b and is electrically connected to the source/drain electrodes 70a and 70b (here should be understood that the pixel electrode 90 is electrically connected to one of the source electrode 70a and the drain electrode 70b). Furthermore, to allow the source/drain electrodes 70a and 70b to be well electrically connected to the active layer 50, an ohmic contact layer 60 is provided between the active layer 50 and the source/drain electrodes 70a and 70b.

Particularly, the passivation layer 80 is provided with a via hole 80a thereon through which the pixel electrode 90 is electrically connected to the source electrode 70a or the drain electrode 70b.

Herein, the material of the gate insulating layer 40 can be $SiN_x$ or $SiO_x$, and the material of the passivation layer 80 can be $SiN_x$ or $SiO_x$.

In the above mentioned array substrate, the gate insulating layer and the passivation layer are removed from the light transmitting region, such that the pixel electrode in the light transmitting region is directly disposed on the glass substrate, thus the light transmittance of the light transmitting region in the pixel structure is increase, so as to increase the utilization of the backlight.

The preparation process of the above mentioned array substrate will be illustrated in details by referring to FIGS. 3a-3h below.

Figure 3A:
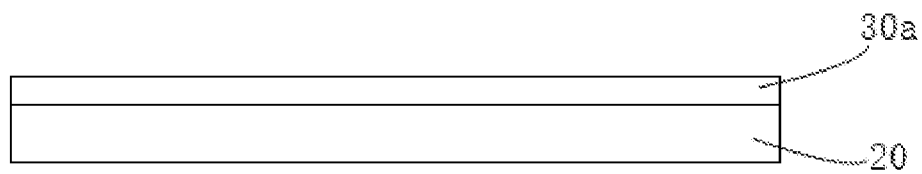
FIGS. 3a-3h illustrate steps for forming products in the preparation method provided by an embodiment of the present invention.
Figure 3B:
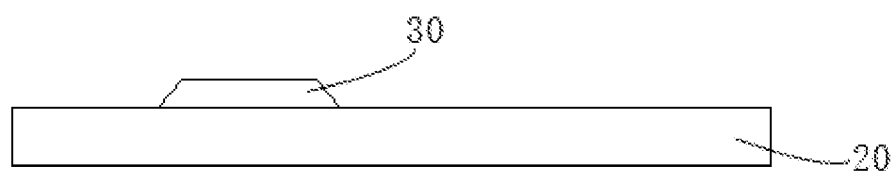

The method of preparing the array substrate comprises the following steps:

S10: preparing a gate electrode 30 on the glass substrate 20. In particular, as shown in FIGS. 3a and 3b, first of all, a layer of gate metal thin film 30a is formed on the glass substrate 20; and then the gate metal thin film 30a is coated with photoresist, and the photoresist of the gate pattern region is reserved by exposing and developing the photoresist; and finally, the exposed gate metal thin film 30a is etched away and the residual photoresist is removed to form the gate electrode 30.

S20: sequentially preparing the gate insulating layer thin film 40a, the active layer 50, the ohmic contact layer 60, and the source/drain electrodes 70a and 70b on the glass substrate 20 after step S10, wherein the gate insulating layer thin film 40a covers the light transmitting region 10a and the light non-transmitting region 10b of the pixel structure 10.

Figure 3C:
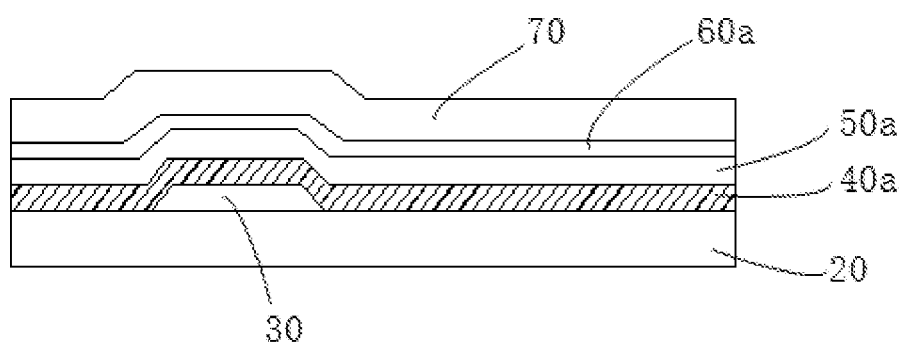
Figure 3D:
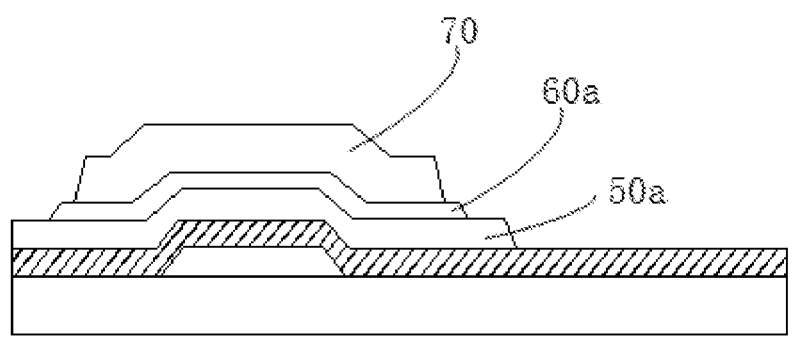
Figure 3E:
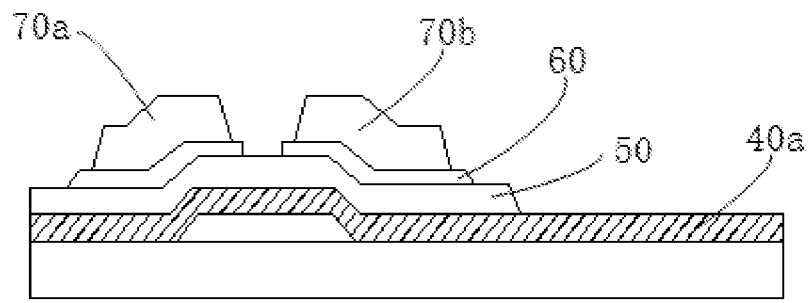

Particularly, referring to FIGS. 3c-3e, first of all, the gate insulating layer thin film 40a, the active layer thin film 50a, the ohmic contact layer thin film 60a, and the source/drain metal thin film 70 are sequentially formed on the glass substrate 20 on which the gate electrode 30 is formed, wherein the source/drain metal thin film 70 is coated with photoresist (not show in the figure), as shown in FIG. 3c.

Then, the photoresist is exposed and developed with a double-tone mask, and the photoresist corresponding to a source region 70a and a drain region 70b, and the photoresist corresponding to a channel region are retained; and the exposed source/drain metal thin film 70, the ohmic contact layer thin film 60a and the active layer thin film 50a are etched away to obtain the structure shown in FIG. 3d.

Finally, the photoresist corresponding to the channel region is removed through ashing process, the ohmic contact layer thin film 60a and the source/drain metal thin film 70 above the channel region are etched, and the residual photoresist is removed to get the gate insulating thin film 40*a*, the active layer 50, the ohmic contact layer 60 and the source/drain electrodes 70*a* and 70*b*, as shown in FIG. 3*e*.

Figure 3F:
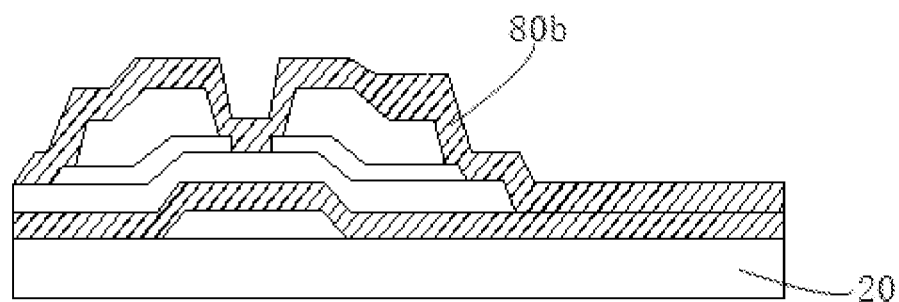

S30: preparing a passivation layer thin film 80*b* on the glass substrate 20 after step S20, wherein the passivation layer thin film 80*b* covers the light transmitting region 10*a* and the light non-transmitting region 10*b* of the pixel structure 10, as shown in FIG. 3*f*.

Figure 3G:
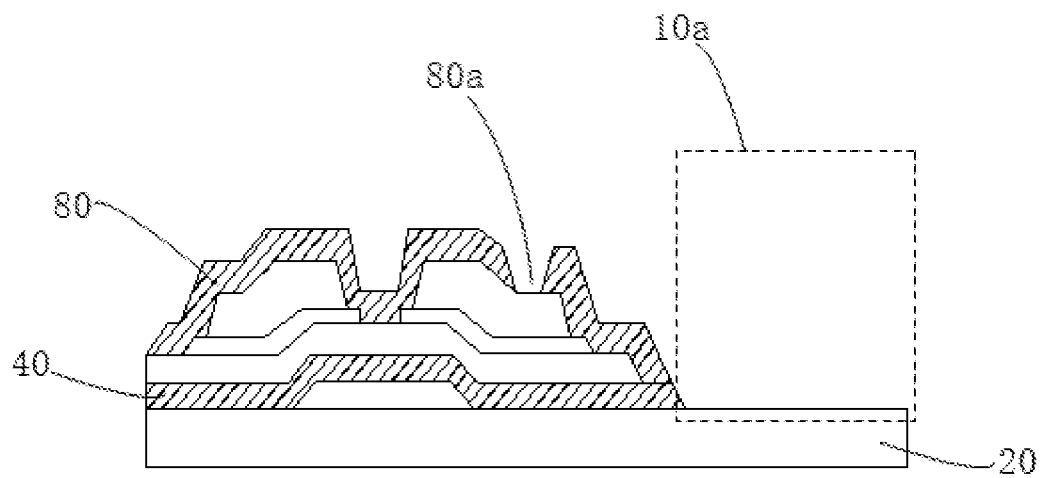

S40: preparing a via hole 80*a* on the passivation layer thin film 80*b* by etching process to expose the source electrode 70*a* or the drain electrode 70*b* electrically connected to the pixel electrode 90; at the same time, etching away the gate insulating layer thin film 40*a* and the passivation layer thin film 80*b* of the light transmitting region 10*a*, such that the light transmitting region 10*a* exposes the glass substrate 20 so obtain the final gate insulating layer 40 and the passivation layer 80. Particularly, the passivation thin film 80*b* is coated with photoresist, and the passivation thin film 80*b* is exposed on a via hole region 80*a* and the light transmitting region 10*a* by exposing and developing the photoresist; the passivation layer thin film 80*b* is removed from the via hole region 80*a* through etching process to obtain the via hole 80*a*; and then the light transmitting region 10*a* exposes the glass substrate 20 by etching away the passivation layer thin film 80*b* and the gate insulating layer thin film 40*a*, as shown in FIG. 3*g*.

Figure 3H:
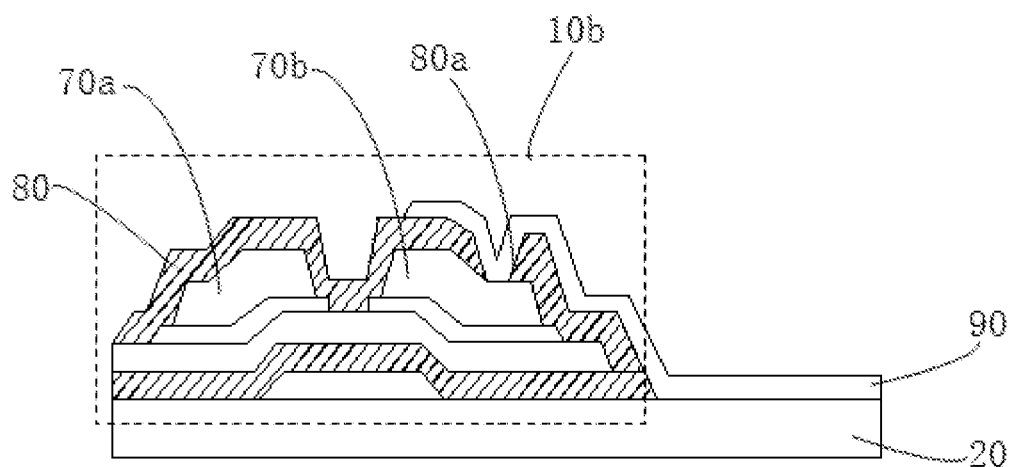

S50: preparing the pixel electrode 90 on the glass substrate 20 after step S40, wherein the pixel electrode 90 in the light transmitting region 10*a* is directly connected to glass substrate 20, and the pixel electrode 90 is electrically connected to the source electrode 70*a* or drain electrode 70*b* through the via hole 80*a*, as shown in FIG. 3*h*.

As for the above preparation process, through one-mask process in step S40, the gate insulating layer thin film and the passivation layer thin film covered on the light transmitting region are etched away when preparing the via hole, no extra process is required, and the process is simple and easy-implementation, and in the end, an array substrate having higher transmittance is prepared.

Figure 4:
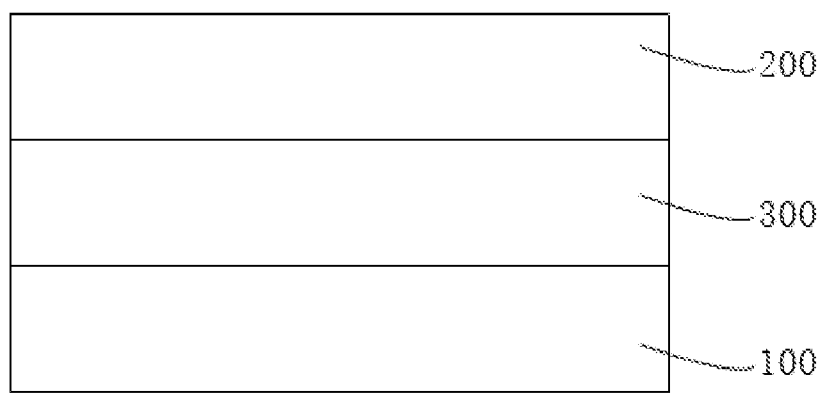
FIG. 4 is a structure diagram of the liquid crystal panel provided in the embodiment of the present invention.

An embodiment of the present invention also provides a liquid crystal panel, as shown in FIG. 4, the liquid crystal panel includes an array substrate 100 and a color filter substrate 200 disposed opposite to each other, and a liquid crystal layer 300 between the array substrate 100 and the color filter substrate 200, wherein the array substrate 100 uses the array substrate provided in the embodiment.

In conclusion, the array substrate and the liquid crystal panel provided according to the embodiments of the present invention improve the pixel structure in the array substrate by removing the gate insulating layer and the passivation layer in the light transmitting region, such that the pixel electrode in the light transmitting region is directly disposed on the glass substrate, to thereby increase the light transmittance of the light transmitting region in the pixel structure, and increase the utilization of the backlight.

It should be explained that the relationship terms, such as first and second, etc., in the present text are only used for distinguishing one entity or operation from another entity or operation without requiring or implying any actual relation or sequence existing between these entities or operations. Moreover, the term "include", "contain" or any other variant means covering instead of exclusively including, so that the process, method, object or device including a series of factors not only includes those factors but also includes other factors that are not explicitly listed or further include inherent factors for this process, method, object or device. Where no more limitations are provided, the factors defined by the sentence "include one . . . " do not exclude additional identical factors existing in the process, method, object or device which includes the factors.

The above statements are only the specific embodiments of the present application, it should be pointed out that, to those ordinary skilled in the art, several improvements and polish can be made without departing from the principle of the present application, also those improvements and polish should be considered as the protection scope of the present application.

The invention claimed is:

1. An array substrate, comprises a glass substrate and a plurality of pixel structures formed on the glass substrate, each pixel structure includes a light transmitting region and a light non-transmitting region, wherein the light non-transmitting region comprises a gate electrode, a gate insulating layer, an active layer, a source electrode, a drain electrode and a passivation layer which are sequentially formed on the glass substrate;

the light transmitting region includes a pixel electrode which is directly formed on the glass substrate, and the pixel electrode extends to the light non-transmitting region and is electrically connected to the source electrode or the drain electrode, wherein the gate insulating layer, the active layer, and the source and drain electrodes are sequentially formed on both the light transmitting and non-transmitting regions of the glass substrate following a preparation of the gate electrode, such that the gate insulating layer thin film covers the light transmitting and non-transmitting regions, wherein the source/drain metal thin film is coated with a photoresist subsequently exposed and developed with a double-tone mask to retain the photoresist corresponding to a source region, a drain region, and a channel region, wherein the exposed region of the source/drain metal thin film, the ohmic contact layer thin film, and the active layer thin film are subsequently etched away and the photoresist corresponding to the channel region is removed through the ashing process, and wherein the ohmic contact layer thin film and the source/drain metal thin film on the channel region are subsequently etched and the residual photoresist is removed to obtain the gate insulating layer thin film, the active layer, the ohmic contact layer and the source/drain electrodes.

2. The array substrate of claim 1, wherein a via hole is provided on the passivation layer and through which the pixel electrode is electrically connected to the source electrode or the drain electrode.

3. The array substrate of claim 1, wherein an ohmic contact layer is provided between the active layer and the source/drain electrodes.

4. The array substrate of claim 1, wherein the material of the gate insulating layer is $SiN_x$ or $SiO_x$.

5. The array substrate of claim 1, wherein the material of the passivation layer is $SiN_x$ or $SiO_x$.

6. A method of preparing an array substrate, comprising:
S10: preparing a gate electrode on a glass substrate;
S20: sequentially forming a gate insulating layer thin film, an active layer, an ohmic contact layer, a source electrode and a drain electrode on the glass substrate after the step S10, wherein the gate insulating layer thin film covers a light transmitting region and a light non-transmitting region of a pixel structure,
coating a photoresist on the source/drain metal thin film, exposing and developing the photoresist with a double-tone mask, and retaining the photoresist corresponding to a source region and a drain region, and the photoresist corresponding to a channel region, etching away the exposed region of the source/drain metal thin film, the ohmic contact layer thin film and the active layer thin film, removing the photoresist corresponding to the channel region through ashing process, and etching the ohmic contact layer thin film and the source/drain metal thin film on the channel region, and removing the residual photoresist to obtain the gate insulating layer thin film, the active layer, the ohmic contact layer and the source/drain electrodes;

S30: preparing a passivation layer thin film on the glass substrate after step S20, wherein the passivation layer thin film covers the light transmitting region and the light non-transmitting region of the pixel structure;

S40: preparing a via hole on the passivation layer thin film by etching process, and etching the gate insulating layer thin film and the passivation layer thin film covered on the light transmitting region, such that the light transmitting region exposes the glass substrate; and S50: preparing a pixel electrode on the glass substrate after step S40, wherein the pixel electrode in the light transmitting region is directly formed on the glass substrate, and the pixel electrode is electrically connected to the source electrode or the drain electrode through the via hole.

7. The method of preparing the array substrate of claim 6, wherein the step S10 specifically comprises:
   forming a layer of gate metal thin film on the glass substrate;
   coating a photoresist on the gate metal thin film and reserving the photoresist of a gate pattern region by exposing and developing the photoresist; and
   etching away the exposed gate metal thin film and removing the residual photoresist so as to form the gate electrode.

8. The method of preparing the array substrate of claim 6, wherein the step S40 specifically comprises:
   coating photoresist on the passivation layer thin film, and exposing the passivation layer thin film on a via hole region and the light transmitting region by exposing and developing the photoresist;
   etching away the passivation layer thin film from the via hole region through etching process, so as to obtain the via hole; and at the same time etching away the passivation layer thin film and the gate insulating layer thin film from the light transmitting region, so as to expose the glass substrate.

9. The method of preparing the array substrate of claim 6, wherein the material of the gate insulating layer thin film is $SiN_x$ or $SiO_x$.

10. The method of preparing the array substrate of claim 6, wherein the material of the passivation layer thin film is $SiN_x$ or $SiO_x$.

11. A liquid crystal panel, comprising: an array substrate and a color filter substrate disposed opposite to each other, and a liquid crystal layer disposed between the array substrate and the color filter substrate, wherein the array substrate comprises a glass substrate and a plurality of pixel structures formed on the glass substrate, each pixel structure includes a light transmitting region comprising a gate electrode, a gate insulating layer, an active layer, a source electrode, a drain electrode and a passivation layer which are sequentially formed on the glass substrate and a light transmitting region including a pixel electrode formed directly on the glass substrate, and extending to the light non-transmitting region to electrically connect to the source electrode or the drain electrode, wherein the gate insulating layer, the active layer, and the source and drain electrodes are sequentially formed on both the light transmitting and non-transmitting regions of the glass substrate following a preparation of the gate electrode, such that the gate insulating layer thin film covers the light transmitting and non-transmitting regions, wherein the source/drain metal thin film is coated with a photoresist subsequently exposed and developed with a double-tone mask to retain the photoresist corresponding to a source region, a drain region, and a channel region, wherein the exposed region of the source/drain metal thin film, the ohmic contact layer thin film, and the active layer thin film are subsequently etched away and the photoresist corresponding to the channel region is removed through the ashing process, and wherein the ohmic contact layer thin film and the source/drain metal thin film on the channel region are subsequently etched and the residual photoresist is removed to obtain the gate insulating layer thin film, the active layer, the ohmic contact layer and the source/drain electrodes.

12. The liquid crystal panel of claim 11, wherein a via hole is provided on the passivation layer and through which the pixel electrode is electrically connected to the source electrode or the drain electrode.

13. The liquid crystal panel of claim 11, wherein an ohmic contact layer is provided between the active layer and the source/drain electrodes.

14. The liquid crystal panel of claim 11, wherein the material of the gate insulating layer is $SiN_x$ or $SiO_x$.

15. The liquid crystal panel of claim 11, wherein the material of the passivation layer is $SiN_x$ or $SiO_x$.

* * * * *